United States Patent
Murano

[19]

[11] Patent Number: 6,163,873
[45] Date of Patent: Dec. 19, 2000

[54] DATA COMMUNICATION METHOD AND SYSTEM

[75] Inventor: Katsumi Murano, Tachikawa, Japan

[73] Assignee: Kabushiki Kaisha Toshiba, Kanagawa, Japan

[21] Appl. No.: 09/125,821

[22] PCT Filed: Dec. 26, 1997

[86] PCT No.: PCT/JP97/04886

§ 371 Date: Aug. 26, 1998

§ 102(e) Date: Aug. 26, 1998

[30] Foreign Application Priority Data

Dec. 27, 1996 [JP] Japan ................................. 8-349584

[51] Int. Cl.[7] .............................................. H03M 13/03
[52] U.S. Cl. ............................................................ 714/782
[58] Field of Search ..................... 714/748, 751, 714/752, 755, 758, 774, 782, 781, 753

[56] References Cited

U.S. PATENT DOCUMENTS 5,699,369  12/1997  Guha ........................................ 714/774
5,828,677  10/1998  Sayeed et al. ........................... 714/774
5,844,918  12/1998  Kato ........................................ 714/751

FOREIGN PATENT DOCUMENTS 62-159540  5/1987  Japan ............................... H04L 1/00
2-164152   6/1990  Japan ............................... H04L 1/18
06205068   7/1994  Japan ............................... H04L 29/02
07336366  12/1995  Japan ............................... H04L 12/28

OTHER PUBLICATIONS

Chang et al., An Adaptive Hybrid FEC?ARQ Protocol Using Turbo Codes, IEEE, pp. 541–545, Aug. 1997.
Decker, An Adaptive Type–II Hybrid ARQ/FEC Protocol Suitable for GSM, IEEE, p. 330–333, Mar. 1994.

Primary Examiner—Albert De Cady
Assistant Examiner—Shelly A Chase
Attorney, Agent, or Firm—Finnegan, Henderson, Farabow, Garrett, & Dunner, L.L.P.

[57] ABSTRACT

A data communication method and system that, when performing real-time type data communication using the same code configuration as for storage type communication wherein error correction is done by retransmission, improve the performance of error correction by using error detection codes effectively, avoiding inefficient-use of the error detection codes, and enhance the quality of the data transmitted. In a detection/correction selector unit (27), a reply frame production unit (31) is directed to request retransmission of error frames discarded by an error detector unit (29) when conducting storage type data communication, while data are twice error-corrected by a second error correction unit (24) and a first error correction unit (28), and are output to a data output unit (30) when conducting real-time type data communication.

12 Claims, 5 Drawing Sheets

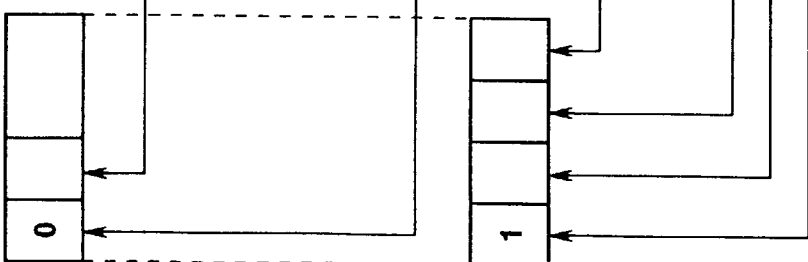
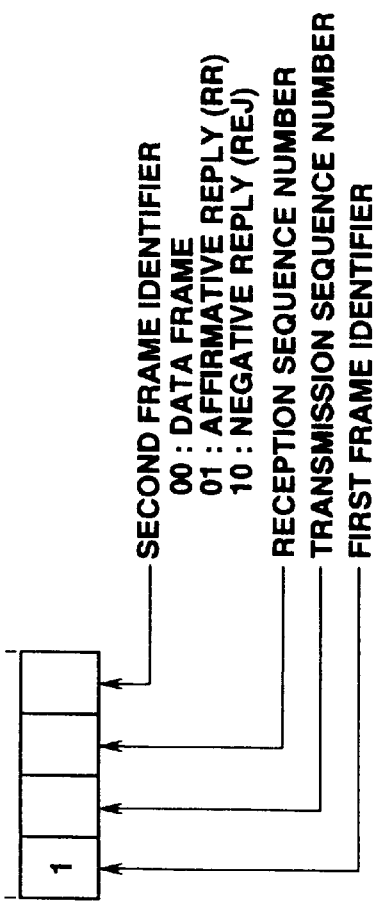
FIG.4(a)
FIG.4(b)
FIG.4(c)

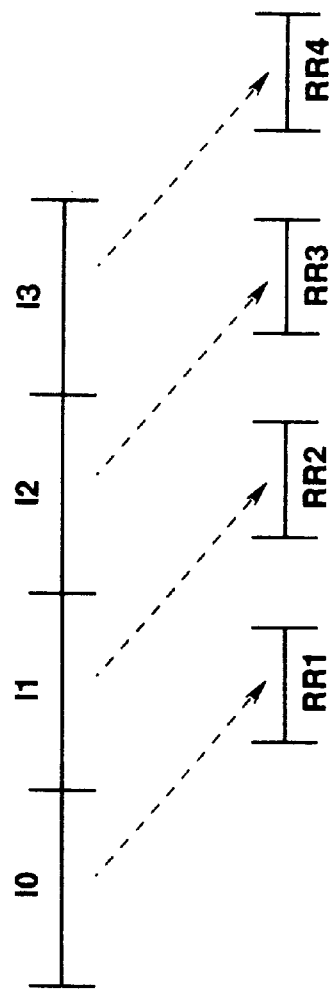
FIG.5(a) NORMAL COMMUNICATION
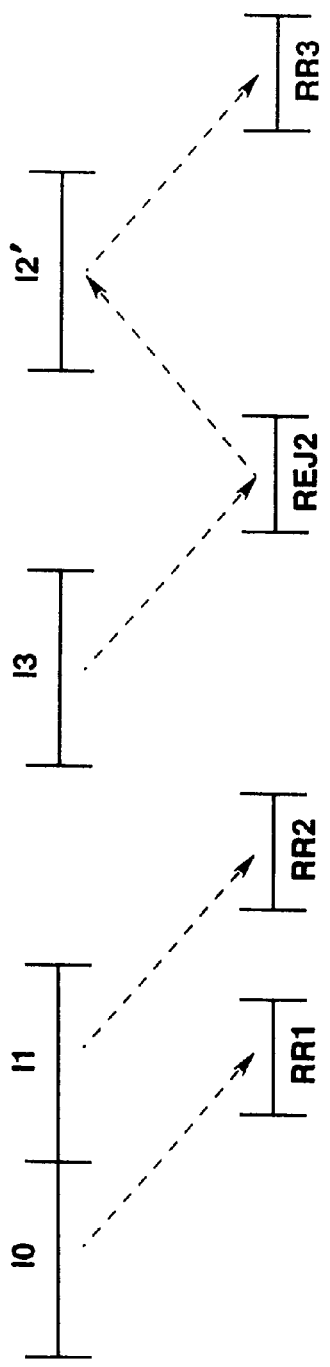
FIG.5(b) WHEN AN ERROR OCCURS
I0, I1, I2, I3, I2' : DATA FRAMES
RR1, RR2, RR3, RR4 : AFFIRMATIVE REPLY FRAMES
REFJ2 : NEGATIVE REPLY FRAME

DATA COMMUNICATION METHOD AND SYSTEM

TECHNICAL FIELD

This invention relates to a data communication method and system, and more particularly to a data communication method and system which effectively uses error detection codes when conducting data communication in real time so that correction performance is improved and the quality of the transmission data is enhanced.

BACKGROUND ART

In a conventional data communication method and system, for data received on the receiving end, a method of correcting data errors using error correction codes, or a method of obtaining correct data by detecting data errors using error detection codes and, when an error is detected, requesting retransmission of the data to the sending end, is utilized.

More recently, a communication apparatus designed for mobile communication employs a method in which error detection codes and error correction codes are used in combination.

In this method, errors in received data are corrected by using error correction codes, and if errors that cannot be corrected by the error correction codes are detected by the error detection codes, retransmission of the data is requested and the correct data is obtained.

With this error correction method in which error detection codes and error correction codes are used in combination, when few errors occur on the transmission path, the error correction codes work effectively, while, when errors occur frequently, the error detection codes are used and errors are corrected by retransmission of the data. Hence, this method is effective for transmission paths where a rate at which error occurs fluctuates, such as in mobile communication.

FIGS. 5(a) and 5(b) show an example of an error correcting sequence for correcting errors by retransmission of data.

The sending end divides data to be transmitted into data frames and sends the data frames to the receiving end. The receiving end performs error corrections on the data frames received. If an error can be corrected by the error corrections, the receiving end sends an affirmative reply frame to the sending end, while if an error cannot be corrected, it sends a negative reply frame as a request for retransmission.

When data frames are sent normally from the sending end to the receiving end as shown in FIG. 5(a), an affirmative reply RR1 is sent from the receiving end to the sending end in response to data frame I0, and an affirmative reply RR2 is sent in response to data frame I1 and so forth.

When an error occurs in a data frame, as for example when an error occurs in the data frame I2 having the transmission sequence number 2 as shown in FIG. 5(b), which is an error that cannot be corrected on the receiving end, the frame I2 is discarded, and the data frame I3 having the transmission sequence number 3 will be input next after the data frame I1 having the transmission sequence number 1. When this happens, although affirmative replies RR1 and RR2 have been sent for the data frames I0 and I1, when the data frame I3 is received, it turns out that the data frame I2 having the transmission sequence number 2 has not arrived. As a result, a negative reply REJ2 is sent from the receiving end, and the sending end transmits I2' which is a retransmission of the data frame I2. If I2' is received normally at the receiving end, an affirmative reply RR3 is sent from the receiving end.

With the above procedure, correct data can be transmitted from the sending end to the receiving end.

However, in the error correction method which uses both the error detection codes and the error correction codes, error correction is performed by data retransmission. Therefore, data transmission delays.

For example, in the case shown in FIG. 5(b), the data frame I2 is not output until the retransmission I2' is received, so the data transmission will be delayed.

For this reason, although errors can be completely corrected in the storage type data communication in the above method, data delays result in fatal errors in the real-time type data communication where moving images or voice data are transmitted, so error correction based on retransmission cannot be used in the real-time type data transmission.

Accordingly, in real-time type data communication, error correction based on retransmission is not performed, and error correction based on error correction codes is performed.

In this case, if no processing is done by using the error detection codes, real-time type data communication can be effected using the same code configurations as with storage type data communication.

However, if real-time type data communication is conducted with the same code configurations as in the storage type data communication which employs an error correction method in which error detection codes and error correction codes are used, as described in the foregoing, no processing is performed by using the error detection codes. Therefore, problems arise in connection with the inefficiencies caused by the error detection codes themselves and by communication speeds that result from the sending of the error codes.

DISCLOSURE OF THE INVENTION

In view of the abovementioned problems in the conventional art, an object of the present invention is to provide a data communication method and system wherewith, when conducting real-time type data communication using the same code configuration as used in storage type communication in which error correction is performed by retransmission, error correction performance can be enhanced, using error detection codes effectively, avoiding inefficient use of the error detection codes, and the quality of the data transmitted can be improved.

In order to realize the object stated above, according to the present invention, a data communication method in which a first code capable of error detection or error correction is added to transmission data to form first data, a second code capable of error correction is added to the first data to form second data, and data transmission and reception are performed by using the second data, is characterized in that in cases where the transmission data constitute real-time type data, a first processing is performed at reception of the second data, wherein the first processing comprises the steps of separating the second code from the second data received, and correcting errors in the first data based on the second code; and separating the first code from the first data for which any error was corrected, and correcting errors in the transmission data based on the first code, and in cases where the transmission data constitute storage type data, a second processing is performed at reception of the second data, wherein the second processing comprises the steps of separating the second code from the second data received, and correcting errors in the first data based on the second code; separating the first code from the first data for which any error was corrected, and detecting errors in the transmission data based on the first code; and when errors are detected, requesting retransmission of the second data to a transmitting end which has transmitted the second data.

In the data communication method, the first code may be CRC code, and the second code may be BCH code.

Further, the data communication method may be configured such that the transmission data contain identification information that identifies whether the transmission data are real-time type data or storage type data, whereby the transmission data are identified as real-time type data or storage type data from the identification information contained in the data from which the first code was separated, and when the transmission data are identified as real-time type data, error correction is performed on the data from which the first code was separated by using the separated first code, and when the transmission data are identified as storage type data, error detection is performed on the data from which the first code was separated by using the separated first code.

Further, the data communication method may be configured such that the transmission data are divided into transmission frames of a prescribed size to which the first code and the second code are added, and are transmitted in unit of the transmission frames, and in that the first processing or the second processing is executed as the same process until reception of the last transmission frame is detected.

Here, the data communication method may be configured such that the transmission frame contains identification information identifying the frame as the last transmission frame, and in that the reception of the last transmission frame is detected based on the identification information contained in the transmission frame.

According to another aspect of the present invention, a data communication system wherein a first code capable of error detection or error correction is added to transmission data to form first data and a second code capable of error correction is added to the first data to form second data in sending-end apparatus, and the second data is transmitted from the sending-end apparatus to receiving-end apparatus, is characterized in that the receiving-end apparatus comprises first separation means for separating the second code from the second data; error correction means for correcting errors in the first data based on the second code separated by the first separation means; second separation means for separating the first code from the first data wherein any error was corrected by the error correction means; first processing means for correcting and outputting errors in the transmission data based on the first code separated by the second separation means; second processing means for detecting errors in the transmission data based on the first code separated by the second separation means and requesting retransmission from the sending-end apparatus when any error is detected; and selection means for selecting either the first processing means or the second processing means in correspondence with the transmission data.

Here, the first code may be CRC code, and the second code may be BCH code.

Further, the data communication system may be configured that processing by the first processing means is selected when the transmission data are real-time type data, and processing by the second processing means is selected when the transmission data are storage type data.

Here, the data communication system may also be configured such that the transmission data contain identification information for identifying whether the transmission data are real-time type data or storage type data, and the selection means identify whether the transmission data are real-time type data or storage type data from the identification information contained in the data from which the first code was separated by the second separation means.

Further, the transmission data may be configured such that the data are divided into transmission frames of a prescribed size to which the first code and the second code are added, and are transmitted in unit of the transmission frames, and in that the selection means select the same processing means until reception of the last transmission frame is detected.

Here, the transmission frame may contains identification information identifying that the frame is the last transmission frame, and in that the selection means detect the reception of the last frame based on the identification information contained in the transmission frame.

BRIEF DESCRIPTION OF THE DRAWINGS

FIGS. 4(a) through 4(c) are diagrams illustrating one example of a frame configuration adopted for the data communication system shown in FIG. 1; and FIGS. 5(a) and 5(b) are diagrams illustrating example sequences resulting when errors are corrected by retransmission.

BEST MODE FOR CARRYING OUT THE INVENTION

An embodiment of the data communication method and system of the present invention is now described in detail, making reference to the attached drawings.

Figure 1:
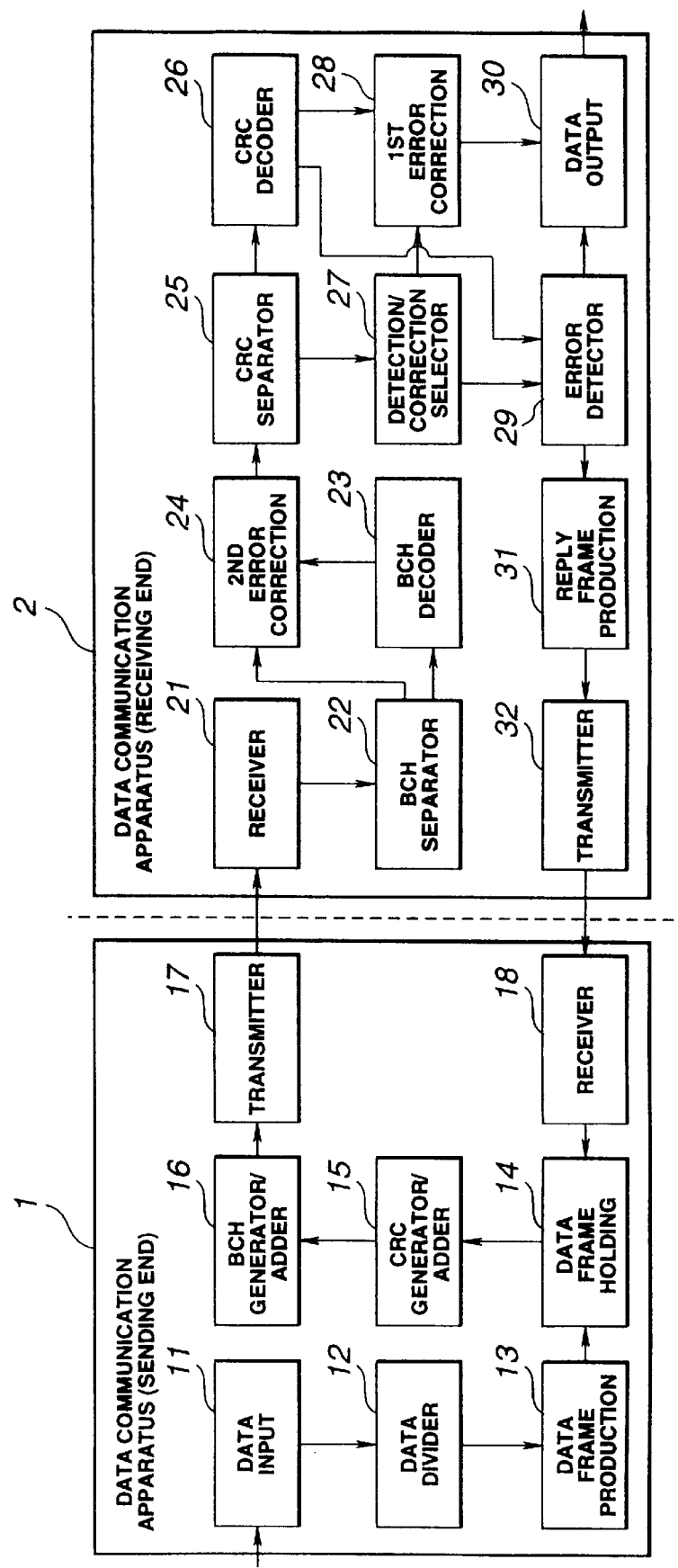
FIG. 1 a block diagram illustrating the configuration of a data communication system concerning the present invention.
Figure 2:
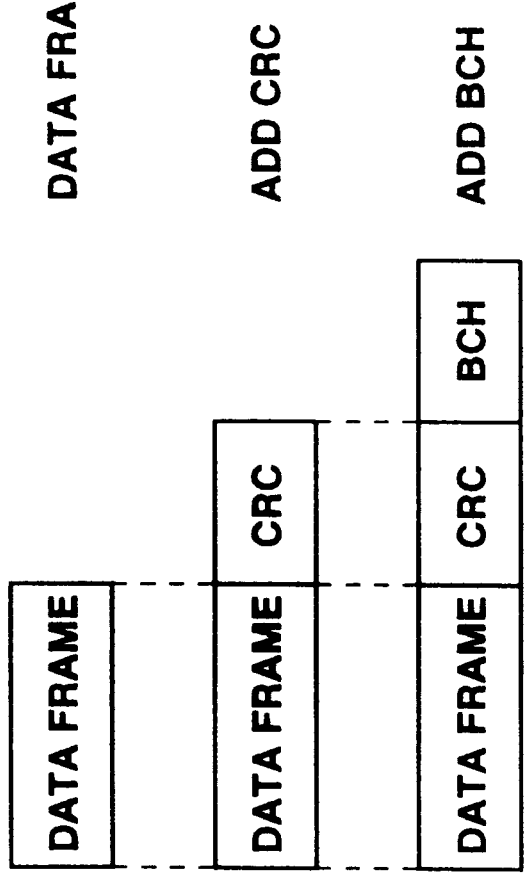
FIGS. 2(a) through 2(c) are diagrams illustrating a data frame configuration adopted in the data communication system shown in FIG. 1.

FIG. 1 is a block diagram illustrating the configuration of a data communication system. FIGS. 2(a) through 2(c) are diagrams illustrating a frame configuration adopted for the data communication system shown in FIG. 1.

The data communication system (sending end) 1 comprises a data input unit 11 for inputting transmission data, a data division unit 12 for dividing the data input to the data input unit 11 according to a prescribed size, a data frame production unit 13 for adding transmission sequence numbers to each of the divided data and produces data frames, a data frame holding unit 14 for temporarily holding the produced data frames, a CRC generation and addition unit 15 for adding CRC (cyclical redundancy check) code to the data frames, a BCH generation and addition unit 16 for adding BCH (Bose-Chaudhuri-Hocquenghem) code, a transmitter 17 for transmitting the data frames to which the CRC code and the BCH code have been added, over the transmission path, and a receiver 18 for receiving data from a communication party.

The data communication system (receiving end) 2 comprises a receiver 21 for the receiving data frames through the transmission path, a BCH separator 22 for separating the BCH code from the received data frames, a BCH decoder 23 for decoding the BCH code, a second error correction unit 24 for correcting errors in the data frames from which the BCH code has been separated, based on the decoded BCH code, a CRC separator 25 for separating CRC code from data frames error-corrected by the second error correction unit 24, a CRC decoder 26 for decoding CRC code, a detection/correction selector unit 27 for selecting whether the data frames from which CRC has been separated are storage type data on which error correction should be performed or real-time type data on which error detection should be performed, a first error correction unit 28 for correcting errors in real-time type data based on decoded CRC code, an error detector unit 29 for detecting errors in storage type data based on decoded CRC code, a data output unit 30 for outputting either error-corrected real-time type data or storage type data in which no errors were detected, a reply frame production unit 31 for producing reply frames to the data transmission point notifying of normal reception or, when there is an error, requesting retransmission, and a transmitter 32 for transmitting reply frames over the transmission path.

In the data communication apparatus (sending end) 1, the data frames that are produced by the data frame production unit 13 are data of a prescribed length to which transmission sequence numbers are added. The transmission sequence numbers indicate the sequence in which the data frames are transmitted, and are used in specifying a particular data frame when requesting a retransmission from the receiving end or processing the retransmission on the receiving end.

The data frames produced by the data frame production unit 13 are temporarily stored in the data frame holding unit 14. After they are sent to the data communication apparatus (receiving end) 2, they are deleted when the reply frame received from the data communication apparatus (receiving end) is an affirmative frame (notifying of normal reception), but are retransmitted when the reply frame is a negative frame (requesting retransmission).

In outputting data frames, to a data frame such as is depicted in FIG. 2(a), CRC code is added at the CRC generator-adder unit 15 as depicted in FIG. 2(b), then BCH code is added at the BCH generator-adder unit 16 as depicted in FIG. 2(c), and transmitted over the transmission path from the transmitter 17.

In the data communication apparatus (receiving end) 2, the BCH separator 22 separates the BCH code from the frame shown in FIG. 2(c) and outputs the frame as shown in FIG. 2(b), and the CRC separator 25 separates the CRC code from the frame shown in FIG. 2(b) and outputs the frame as shown in FIG. 2(a). The processing performed by this data communication apparatus (receiving end) 2 will be described later.

In FIG. 1, the data communication apparatus (sending end) 1 and the data communication apparatus (receiving end) 2 are described separately. However, in actual practice, data communication apparatus is configured such that it comprises both a sending end and a receiving end so that both transmission and reception can be conducted.

The operations of the data communication apparatus (receiving end) 2 are now described, making reference to FIGS. 3 and 4(a) through 4(c).

Figure 3:
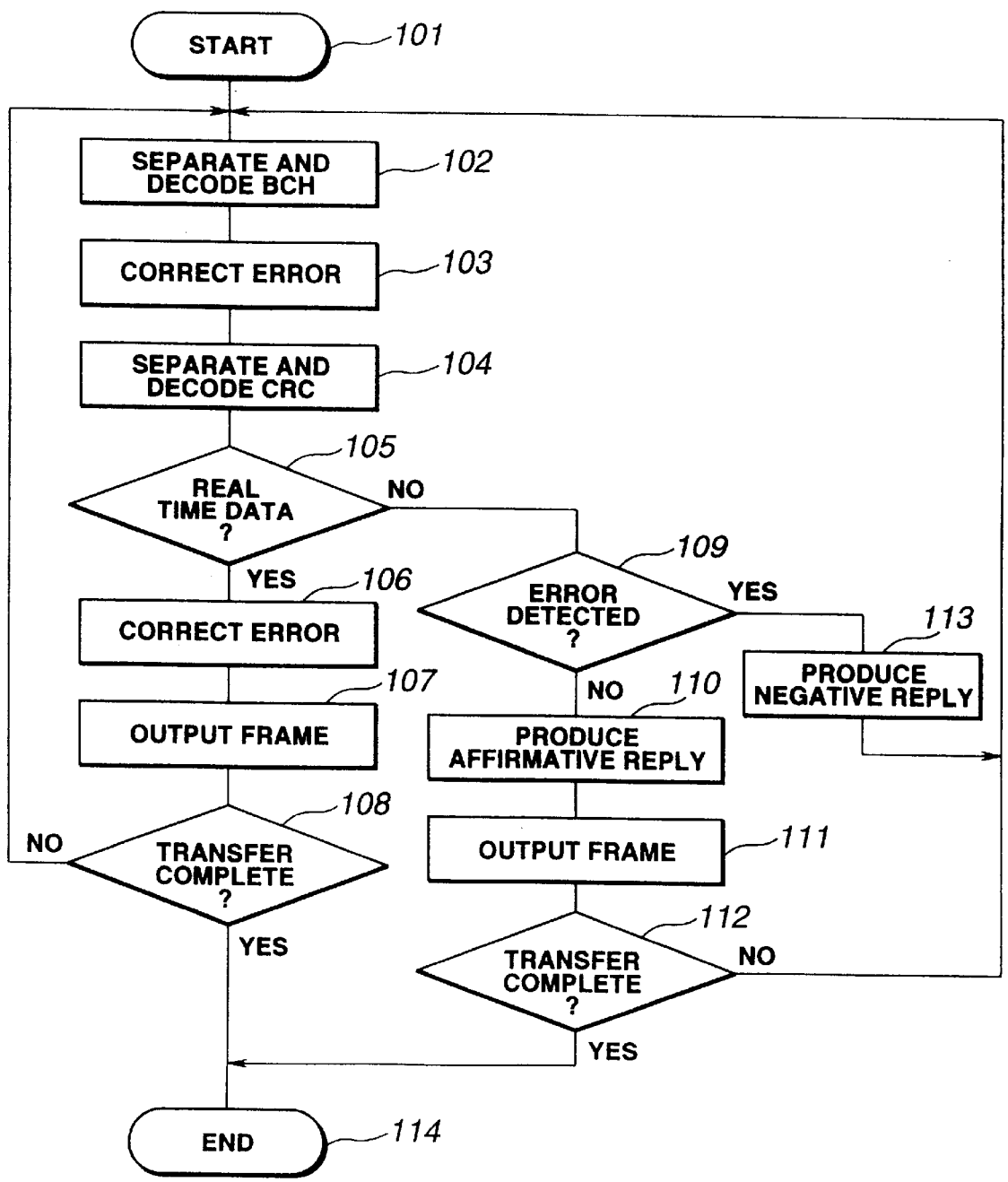
FIG. 3 is a flowchart illustrating the flow of operations in the data communication system on the receiving end as shown in FIG. 1.

FIG. 3 is a flowchart illustrating the flow of operations in the data communication apparatus on the receiving end, while FIGS. 4(a) through 4(c) are diagrams illustrating an example of data frame configuration.

The data communication apparatus (receiving end) 2 begins operating when the receiver 21 receives a data frame to which BCH code and CRC have been added (step 101). First, the BCH separator 22 separates the BCH code from the received data frame, and the BCH decoder 23 decodes the separated BCH code (step 102).

Next, the second error correction unit 24 performs error correction on the data frame separated by the BCH separator 22, based on BCH code decoded by the BCH decoder 23 (step 103), the CRC separator 25 separates the CRC code from the data frame error-corrected by the second error correction unit 24, and the CRC decoder 26 decodes the separated CRC code (step 104).

At this point, the detection/correction selector unit 27 determines whether the data frame from which the CRC code was separated by the CRC separator 25 constitutes real-time type data or storage type data (step 105). As shown in FIG. 4(a), the data frame consists of an information field which contains data of a prescribed length to which a control field containing control data is attached. As shown in FIG. 4(b), a frame wherein the first bit in the control field is "0" is a frame indicating the start and end of communication and the type of communication. The frame in which "00" follows this "0" indicates the start of storage type communication. The frame in which "01" follows this "0" indicates the start of real time communication. And a frame in which "10" follows this "0" indicates the end of communication.

When the detection/correction selector unit 27 determines that the received data are real-time type data (Yes in step 105), the first error correction unit 28 performs error correction on the data frame which has been separated by the CRC separator 25 based on the CRC which has been decoded by the CRC decoder 26 (step 106), and the data output unit 30 outputs the data frame which has been error-corrected by the first error correction unit 28 (step 107).

These processings are repeated until the data transfer is complete (No in step 108). When all data have been completely transferred (Yes in step 108), the data communication apparatus (receiving end) 2 ends its operations (step 114).

On the other hand, when the detection/correction selector unit 27 determines that the received data are storage type data (No in step 105), the error detector unit 29 performs error detection on the data frame which has been separated by the CRC separator 25 based on the CRC code which has been decoded by the CRC decoder 26 (step 109). If no error is detected, the reply frame production unit 31 produces an affirmative reply frame to inform the data communication apparatus (sending end) 1 that the data frame was received normally, which reply frame is transmitted over the transmission path from the transmitter 32 (step 110), and the data output unit 30 outputs the data frame (step 111).

These processings are repeated until the data transfer is complete (No in step 112). When, during this time, the error detector unit 29 detects an error in a data frame (Yes in step 109), the reply frame production unit 31 produces a negative reply frame to request that the data communication apparatus (sending end) retransmit that data frame, and sends this reply frame over the transmission path from the transmitter 32 (step 113). Reception processing is continued from the data frame retransmitted in response to that reply frame. When all data have been completely transferred normally (Yes in step 112), the data communication apparatus (receiving end) terminates its operations (step 114).

As shown in FIG. 4(c), in the reply frame produced by the reply frame production unit 31, the second frame identification becomes "01" in the affirmative reply and "10" in the negative reply.

In terms of errors in storage type data, the error detector unit 29 not only detects bit errors in a given data frame, but also determines from the transmission sequence number of that data frame whether it was received in correct sequence or not.

In this embodiment, CRC and BCH code are used as the error detection and error correction codes. Alternatively, it is possible to perform error detection and correction by other methods such as those employing Hamming code or convolutional code.

In this embodiment, furthermore, the data frames to be transmitted and received were described in terms of fixed lengths, but the same processing can be performed on data frames of variable-length.

INDUSTRIAL APPLICABILITY

The present invention is a data communication method and system that enhance error correction performance by effectively utilizing error detection codes, and improve the quality of transmission data. The present invention makes it possible to perform error correction by retransmission and transfer correct data when the communication is conducted in the storage type mode, or enhance error correction functions and transfer data without delay when the communication is being done in real time, without altering the configuration of the error detection codes and error correction codes, etc., which are added to the data to be transferred.

What is claimed is:

1. A data communication system wherein a first code capable of error detection or error correction is added to transmission data to form first data and a second code capable of error correction is added to the first data to form second data in sending apparatus, and the second data is transmitted from the sending apparatus to receiving apparatus, the receiving apparatus comprising:

first separation means for separating the second code from the second data;

error correction means for correcting errors in the first data based on the second code separated by the first separation means;

second separation means for separating the first code from the first data wherein any error was corrected by the error correction means;

first processing means for correcting errors in the transmission data based on the first code separated by the second separation means and outputting the corrected transmission data;

second processing means for detecting errors in the transmission data based on the first code separated by the second separation means and requesting retransmission from the sending apparatus when any error is detected; and selection means for selecting either the first processing means or the second processing means in accordance with the transmission data.

2. The data communication system according to claim 1, wherein the first code is CRC code, and the second code is BCH code.

3. The data communication system according to claim 1, wherein the selection means selects processing by the first processing means when the transmission data are real-time type data, and processing by the second processing means when the transmission data are storage type data.

4. The data communication system according to claim 3, wherein the transmission data contain identification information for identifying whether the transmission data are real-time type data or storage type data, and the selection means identifies whether the transmission data are real-time type data or storage type data based on the identification information contained in the data from which the first code was separated by the second separation means.

5. The data communication system according to claim 1, wherein the transmission data are divided into transmission frames of a prescribed size to which the first code and the second code are added, and are transmitted in units of the transmission frames, and in that the selection means selects the same processing means until reception of the last transmission frame is detected.

6. The data communication system according to claim 5, wherein the transmission frame contains identification information identifying that the frame is the last transmission frame, and in that the selection means detects the reception of the last frame based on the identification information contained in the transmission frame.

7. A data receiving apparatus wherein a first code capable of error detection or error correction is added to transmission data to form first data and a second code capable of error correction is added to the first data to form second data in sending apparatus, and the second data is received from the sending apparatus, comprising:

first separation means for separating the second code from the second data;

error correction means for correcting errors in the first data based on the second code separated by the first separation means;

second separation means for separating the first code from the first data wherein any error was corrected by the error correction means;

first processing means for correcting errors in the transmission data based on the first code separated by the second separation means and outputting the corrected transmission data;

second processing means for detecting errors in the transmission data based on the first code separated by the second separation means and requesting retransmission from the sending apparatus when any error is detected; and selection means for selecting either the first processing means or the second processing means in accordance with the transmission data.

8. The data receiving apparatus according to claim 7, wherein the first code is CRC code, and the second code is BCH code.

9. The data receiving apparatus according to claim 7, wherein the selection means selects processing by the first processing means when the transmission data are real-time type data, and processing by the second processing means when the transmission data are storage type data.

10. The data receiving apparatus according to claim 9, wherein the transmission data contain identification information for identifying whether the transmission data are real-time type data or storage type data, and the selection means identifies whether the transmission data are real-time type data or storage type data based on the identification information contained in the data from which the first code was separated by the second separation means.

11. The data receiving apparatus according to claim 7, wherein the transmission data are divided into transmission frames of a prescribed size to which the first code and the second code are added, and are transmitted in units of the transmission frames, and the selection means selects the same processing means until reception of the last transmission frame is detected.

12. The data receiving apparatus according to claim 11, wherein the transmission frame contains identification information identifying that the frame is the last transmission frame, and the selection means detects the reception of the last frame based on the identification information contained in the transmission frame.

* * * * *